United States Patent
Hiasa et al.

(10) Patent No.: US 11,361,934 B2
(45) Date of Patent: Jun. 14, 2022

(54) ION SOURCE DEVICE

(71) Applicant: SUMITOMO HEAVY INDUSTRIES, LTD., Tokyo (JP)

(72) Inventors: Toshikazu Hiasa, Tokyo (JP); Manami Taniguchi, Ehime (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 72 days.

(21) Appl. No.: 16/820,016

(22) Filed: Mar. 16, 2020

(65) Prior Publication Data
US 2020/0219695 A1    Jul. 9, 2020

Related U.S. Application Data

(63) Continuation of application No. PCT/JP2017/034323, filed on Sep. 22, 2017.

(51) Int. Cl.
*H01J 37/08* (2006.01)
*H01J 37/02* (2006.01)
(Continued)

(52) U.S. Cl.
CPC ............ *H01J 37/08* (2013.01); *H01J 37/023* (2013.01); *H01J 37/063* (2013.01);
(Continued)

(58) Field of Classification Search
CPC ........ H01J 37/08; H01J 37/023; H01J 37/063; H01J 37/32449; H01J 37/32788; H01J 2237/002
See application file for complete search history.

(56) References Cited

U.S. PATENT DOCUMENTS 4,423,355 A * 12/1983 Kageyama ............. H01J 27/04
250/426
7,655,931 B2    2/2010 Gupta
(Continued)

FOREIGN PATENT DOCUMENTS

JP    S62-108428 A    5/1987
JP    H05-73849 U    10/1993
(Continued)

OTHER PUBLICATIONS

Publisher: JP08007822, Author: Matsumoto Takao, Title:ION implanting device, Date: Jan. 12, 1996, pp. 1-36 (Year: 1996).*
(Continued)

*Primary Examiner* — Wei (Victor) Y Chan
(74) *Attorney, Agent, or Firm* — Michael Best & Friedrich LLP

(57) ABSTRACT

There is provided an ion source device including a pair of first electrodes for emitting an electron, a second electrode that defines a region in which the electron is enclosed and to which raw material source gas is supplied, between the pair of first electrodes, and that has a hole portion through which an ion generated by collision between the electron and the material gas is extruded, an extraction electrode disposed apart from the second electrode along an extraction direction of the ion extracted from the second electrode so that a potential difference is formed between the second electrode and the extraction electrode, and an intermediate electrode disposed between the second electrode and the extraction electrode. A first potential difference between the second electrode and the intermediate electrode is greater than a second potential difference between the second electrode and the extraction electrode.

16 Claims, 4 Drawing Sheets

(51) Int. Cl.
  *H01J 37/063* (2006.01)
  *H01J 37/32* (2006.01)
(52) U.S. Cl.
  CPC .. *H01J 37/32449* (2013.01); *H01J 37/32669* (2013.01); *H01J 37/32788* (2013.01); *H01J 2237/002* (2013.01)

(56) References Cited

U.S. PATENT DOCUMENTS

| | | | |
|---|---|---|---|
| 2010/0038556 A1* | 2/2010 | Miyamoto | H01J 27/08 250/423 R |
| 2011/0089336 A1* | 4/2011 | Kasuya | H01J 1/304 250/424 |
| 2014/0265856 A1 | 9/2014 | Hahto et al. | |
| 2014/0353518 A1* | 12/2014 | Sato | H01J 27/024 250/424 |
| 2015/0187381 A1* | 7/2015 | Ota | C23C 14/221 427/599 |
| 2016/0086759 A1 | 3/2016 | Horsky et al. | |
| 2018/0350564 A1* | 12/2018 | Vane | H01J 37/32449 |

FOREIGN PATENT DOCUMENTS

| | | |
|---|---|---|
| JP | H08-007822 A | 1/1996 |
| JP | H11-185647 A | 7/1999 |
| JP | 2001-126630 A | 5/2001 |
| JP | 2001-167707 A | 6/2001 |
| JP | 2001-202896 A | 7/2001 |
| JP | 2002-025797 A | 1/2002 |
| JP | 2002-134042 A | 5/2002 |
| JP | 2010-522966 A | 7/2010 |
| JP | 2014-183041 A | 9/2014 |

OTHER PUBLICATIONS

Publisher: JP2001126630, Author: Yamashita, Title: ION source, Date:May 11, 2001, pp. 1-15(Year: 2001).*
Publisher: JP2001126630, Author: Yamashita, Title: ION source, Date:May 11, 2001, pp. 1-15 (Translation) (Year: 2001).*
Office Action issued in Japanese Application No. 2016-070402, dated Sep. 10, 2019.
Office Action issued in Japanese Application No. 2016-070402, dated Mar. 31, 2020.
International Search Report issued in Application No. PCT/JP2017/034323, dated Dec. 19, 2017.
Office Action issued in Japanese Application No. 2016-070402, dated Jun. 16, 2021.

* cited by examiner

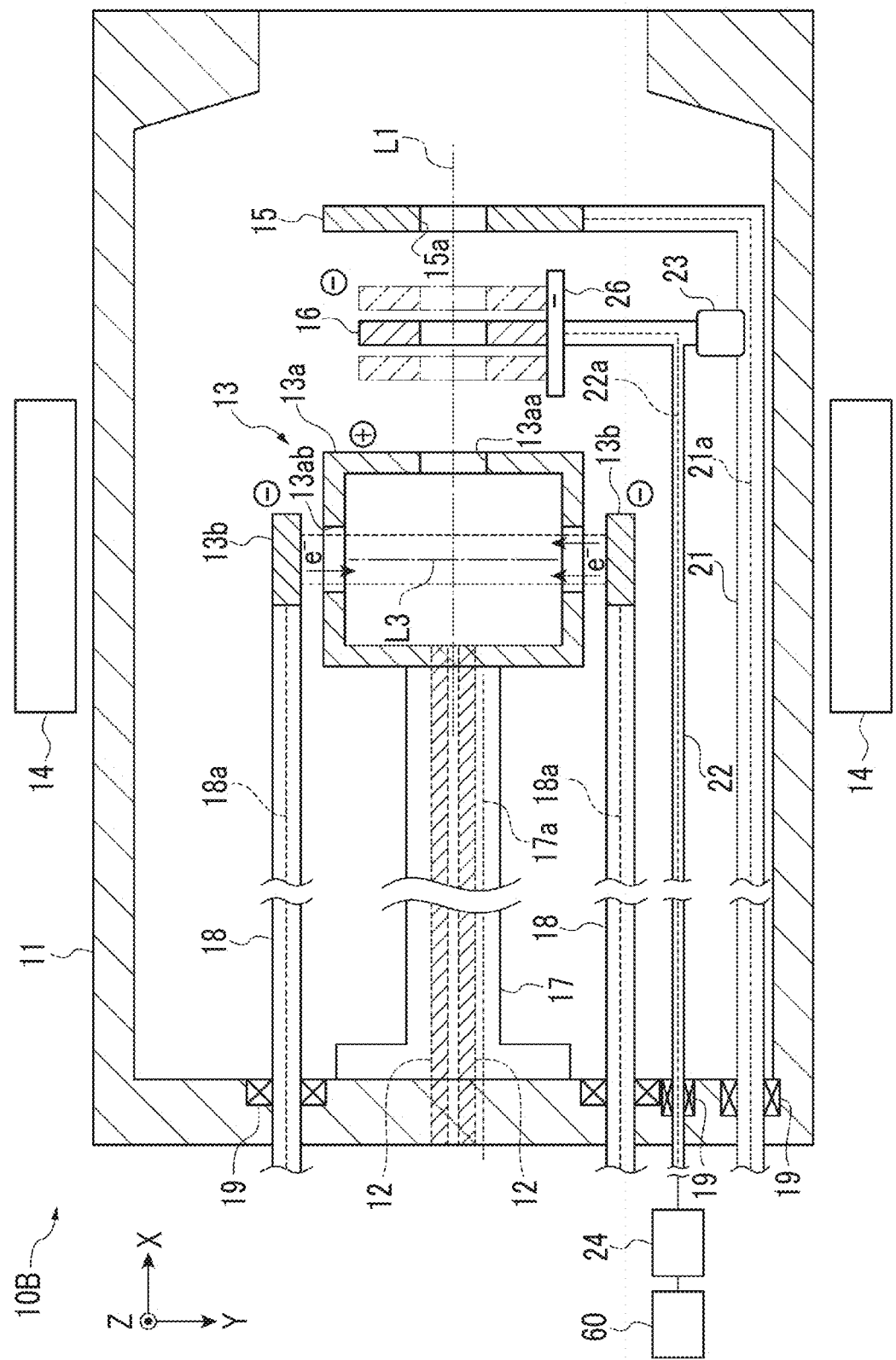

ION SOURCE DEVICE

RELATED APPLICATIONS

The contents of International Patent Application No. PCT/JP2017/034323, on the basis of which priority benefits are claimed in an accompanying application data sheet, are in their entirety incorporated herein by reference.

BACKGROUND

Technical Field

Certain embodiments of the present invention relate to an ion source device.

Description of Related Art

In the related art, as a particle acceleration system, a system is known which includes an ion source device that generates an ion, an accelerator that accelerates the ion, and a transport unit that transports the ion from the ion source device to the accelerator. In this particle acceleration system, a magnetic field is formed inside a container of the ion source device, and an electron and a gas molecule are introduced into the container. In this case, when intensity of the magnetic field is properly adjusted, the electron is enclosed inside the container by an action of the magnetic field. The electron enclosed inside the container collides with the gas molecule. As a result, the ion in a plasma state is generated inside the container. When an extraction voltage is applied to an extraction electrode disposed at a position apart from the container, the ion is extracted from the inside of the container with energy corresponding to the extraction voltage. The extracted ion is transported to the accelerator by the transport unit.

SUMMARY

According to an embodiment of the present invention, there is provided an ion source device including a pair of first electrodes for emitting an electron, a second electrode that defines a region in which the electron is enclosed and to which raw material source gas is supplied, between the pair of first electrodes, and that has a hole portion through which an ion generated by collision between the electron and the material gas is extruded, an extraction electrode disposed apart from the second electrode along an extraction direction of the ion extracted from the second electrode so that a potential difference is formed between the second electrode and the extraction electrode, and an intermediate electrode disposed between the second electrode and the extraction electrode. A first potential difference between the second electrode and the intermediate electrode is greater than a second potential difference between the second electrode and the extraction electrode.

According to the ion source device, the ion generated in the region defined by the second electrode is extracted from the hole portion with an extraction current value and extraction energy which correspond to the potential difference between the second electrode and the intermediate electrode. Between the intermediate electrode and the extraction electrode, the extraction energy is changed to correspond to the potential difference between the intermediate electrode and the extraction electrode. However, the extraction current value is maintained. Therefore, the extraction energy is determined, based on the second potential difference between the second electrode and the extraction electrode. The second potential difference can be determined to satisfy the required extraction energy. On the other hand, the extraction current value is determined, based on the first potential difference between the second electrode and the intermediate electrode. Therefore, the potential difference for determining the extraction current value can be set without being affected by the potential difference for determining the extraction energy. The first potential difference is greater than the second potential difference. Accordingly, it is possible to further increase the extraction current value determined by the potential difference based on the extraction energy. In this manner, an extraction current can be increased while required extraction energy is satisfied.

BRIEF DESCRIPTION OF THE DRAWINGS

FIG. 4 is a sectional view when an internal structure of an ion source device according to another embodiment is viewed from the positive direction of the Z-axis.

DETAILED DESCRIPTION

Figure 1:
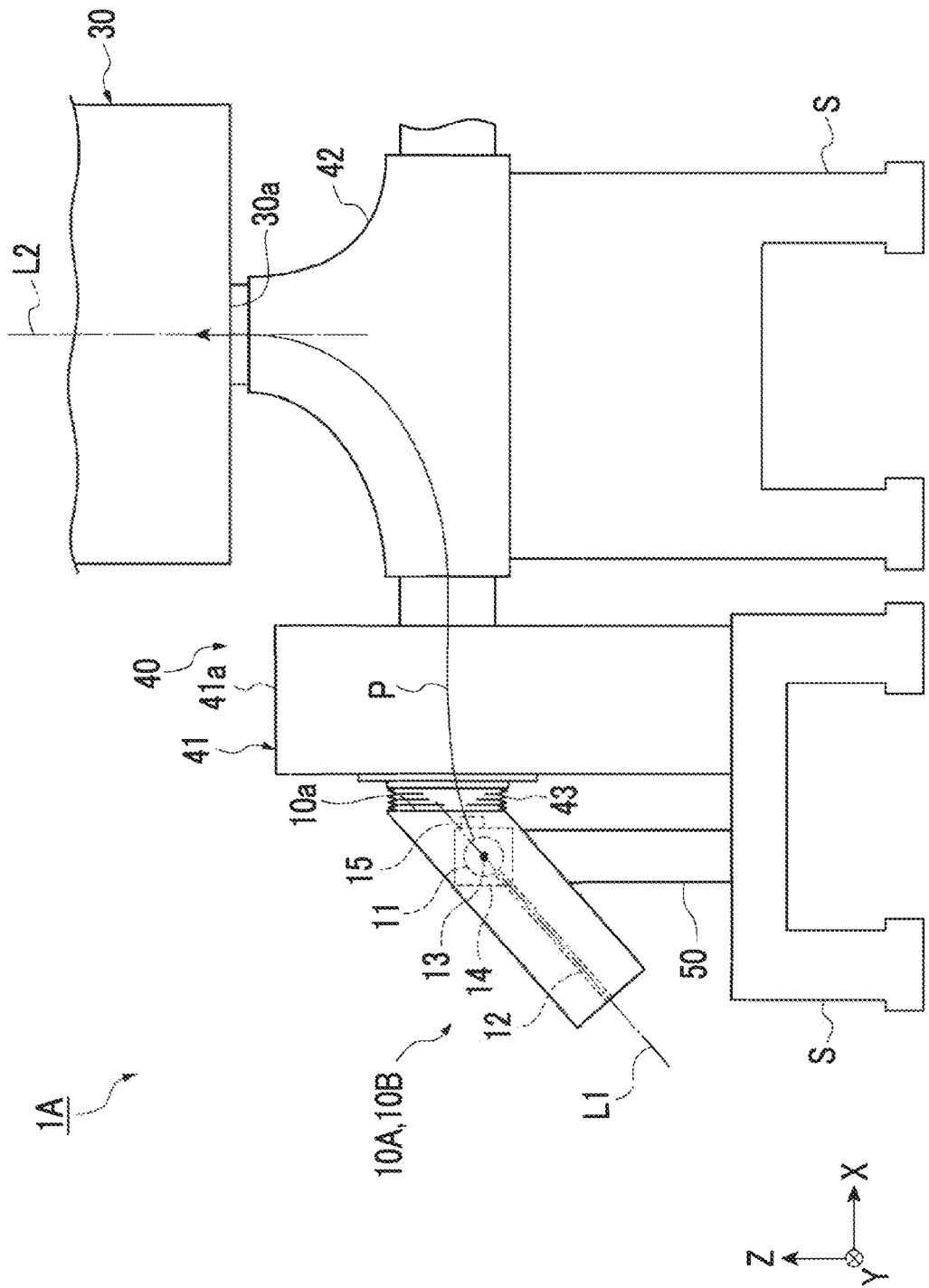
FIG. 1 is a view illustrating a particle acceleration system including an ion source device according to an embodiment of the present invention.

In an ion source device, it is desirable to increase an extraction current value. The extraction current value of the ion source device is determined by parameters such as a distance and a potential difference between a container that generates an ion and an extraction electrode. However, the parameters are determined, based on other performances required for the ion source device, such as emitting performance of extraction energy and an ion beam. Therefore, the parameters for increasing the extraction current value cannot be freely set. Accordingly, it is difficult to increase the extraction current value.

Therefore, it is desirable to provide an ion source device capable of increasing the extraction current value while a performance required for the ion source device is satisfied.

A potential of the second electrode may be a positive potential. A potential of the intermediate electrode may be a negative potential. A potential of the extraction electrode may be a ground potential. According to this configuration, a positive ion having desired extraction energy and a desired extraction current value can be extracted.

The ion source device may further include a potential adjustment unit that adjusts a potential of the intermediate electrode. According to this configuration, it is possible to adjust the first potential difference between the second electrode and the intermediate electrode. The first potential difference determines the extraction current value. Therefore, it is possible to control a magnitude of the extraction current value.

In order to control the distance between the second electrode and the intermediate electrode, the ion source device may further include a position adjustment unit that adjusts a position of the intermediate electrode in order to control a distance between the second electrode and the intermediate electrode. According to this configuration, it is possible to adjust the distance between the second electrode and the intermediate electrode. This distance determines the extraction current value. Therefore, it is possible to control a magnitude of the extraction current value.

According to the embodiment of the present invention, there is provided an ion source device capable of increasing an extraction current value while a required performance is satisfied.

Hereinafter, embodiments according to the present invention will be described in detail with reference to the accompanying drawings. In the description of the drawings, the same reference numerals will be assigned to the same elements, and repeated description will be omitted.

Embodiment

FIG. 1 is a front view illustrating a particle acceleration system having an ion source device according to an embodiment. As illustrated in FIG. 1, a particle acceleration system 1A includes an ion source device 10A, an accelerator 30, a transport unit 40, and a support portion 50. In the following description, an upward-downward direction of the device in a state where the particle acceleration system 1A is placed on a horizontal surface is defined as a Z-axis direction. A direction perpendicular to the Z-axis direction within a plane including a transport path P of an ion (to be described later) is defined as an X-axis direction. A direction perpendicular to the Z-axis direction and the X-axis direction is defined as a Y-axis direction. The particle acceleration system 1A generates and accelerates ions such as α-particles, protons, and deuterons. The particle acceleration system 1A supplies the accelerated ion to a device that performs positron emission tomography (PET) and boron neutron capture therapy (BNCT), for example.

In the particle acceleration system 1A, the ion source device 10A and the accelerator 30 are connected to each other by the transport unit 40. The ion source device 10A, the accelerator 30, and the transport unit 40 are disposed on a ZX-plane. The transport unit 40 is disposed on a side in a positive direction of an X-axis with respect to the ion source device 10A, and the accelerator 30 is disposed on a side in a positive direction of a Z-axis of the transport unit 40. The support portion 50 is disposed on a lower side (in a negative direction of the Z-axis) of the ion source device 10A. The particle acceleration system 1A is placed on a pedestal S.

The ion source device 10A generates the ion in a plasma state from a gas molecule. The ion source device 10A can generate a plurality of types of the ion. For example, the ion source device 10A can generate α-particles from helium, and can generate protons from hydrogen. The ion source device 10A may not necessarily be able to generate the α-particles and the protons. A specific configuration of the ion source device 10A will be described later.

The accelerator 30 accelerates the ion generated by the ion source device 10A to generate a charged particle beam. In the present embodiment, a cyclotron will be described as an example of the accelerator 30. The accelerator 30 is not limited to the cyclotron, and may be a synchrotron, a synchrocyclotron, or a linear accelerator.

The accelerator 30 has a substantially cylindrical shape, and is disposed in an extending direction of a center axis L2 in the Z-axis direction. The accelerator 30 is disposed at a position higher in the Z-axis direction than that of the ion source device 10A. When the ion to be accelerated is incident into a predetermined position of the accelerator 30, the accelerator 30 accelerates the ion. In the accelerator 30, the ion to be accelerated is incident into an incident portion 30a which is open in a central portion on a lower surface side (surface in the negative direction of the Z axis) of the accelerator 30. The center axis L2 of the accelerator 30 may not extend in the Z-axis direction. For example, in a state where the whole particle acceleration system 1A illustrated in the drawing is rotated by 90° around the Y-axis, the center axis L2 may extend in the X-axis direction. In a state where the whole particle acceleration system 1A illustrated in the drawing is rotated by 90° around the X axis, the center axis L2 may extend in the Y-axis direction. In this case, a center axis L1 of the ion source device 10A is located inside an XY-plane.

The transport unit 40 transports the ion generated by the ion source device 10A to the accelerator 30 from the ion source device 10A. The transport unit 40 has an einzel lens 41, a bending electromagnet 42, and a bellows 43. The einzel lens 41 converges the transported ion. The bending electromagnet 42 generates a magnetic field, and uses the magnetic field so that a transport direction of the ion passing through the einzel lens 41 is bent inside a ZX-plane. The bending electromagnet 42 guides the ion to the incident portion 30a of the accelerator 30.

The support portion 50 is a mechanism that supports the ion source device 10A. The support portion 50 is a plurality of pedestals that can be attached to and detached from the ion source device 10A. Each of the plurality of pedestals configuring the support portion 50 may support the ion source device 10A so that the ion source device 10A has mutually different attachment angles and attachment positions with respect to the transport unit 40. That is, the support portion 50 exchanges the plurality of attachable and detachable pedestals. In this manner, the support portion 50 can adjust the attachment angle and the attachment position of the ion source device 10A with respect to the transport unit 40. The support portion 50 is supported by the pedestal S on a side opposite to a side connected to the ion source device 10A.

Hereinafter, a configuration of the ion source device 10A will be described in detail.

The ion source device 10A is an external ion source disposed outside the accelerator 30. The ion source device 10A has a substantially cylindrical shape, and the center axis L1 is located inside the ZX-plane. The ion source device 10A has an end surface 10a obliquely inclined with respect to the center axis L1, in one end in an extending direction of the ion source device 10A. The ion source device 10A is disposed so that the end surface 10a is substantially perpendicular. The end surface 10a faces an outer surface of the einzel lens 41 of the transport unit 40 on a side in the negative direction of the X axis of a housing 41a. The ion source device 10A is disposed in a state where the center axis L1 is inclined so that one end side which is the end surface 10a side is located higher than the other end side in the Z-axis direction, inside the ZX-plane.

Figure 2:
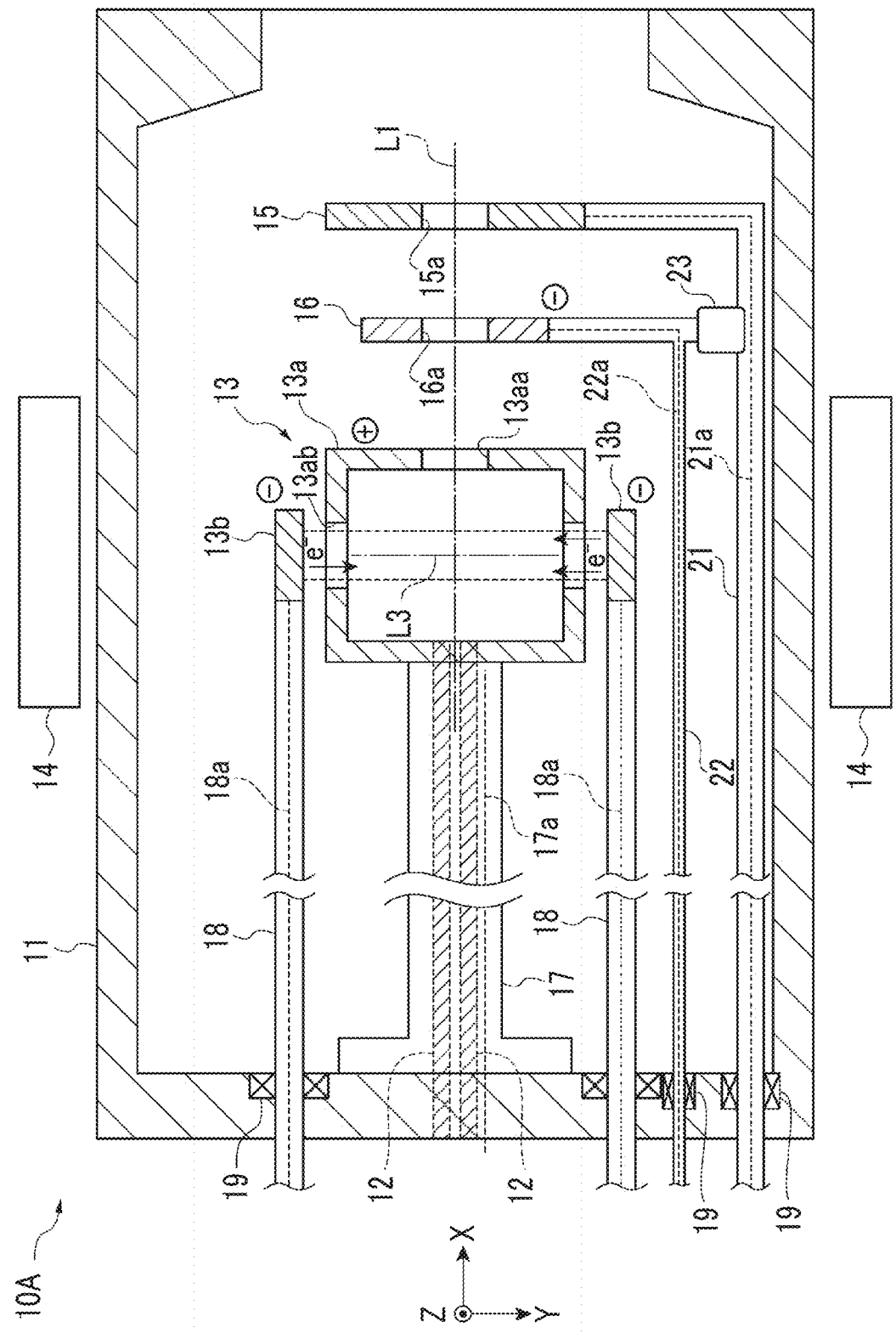
FIG. 2 is a sectional view when an internal structure of the ion source device according to one embodiment is viewed in a positive direction of a Z-axis.

FIG. 2 is a sectional view when an internal structure of the ion source device 10A in FIG. 1 is viewed in the positive direction of the Z axis. As illustrated in FIG. 2, the ion source device 10A has a vacuum box 11, a gas molecule flow path 12, an electrode 13, an electromagnet 14, an extraction electrode 15, and an intermediate electrode 16.

The vacuum box 11 is disposed inside the ion source device 10A. The vacuum box 11 is connected to a vacuum pump (not illustrated), and is internally held in a vacuum state. The gas molecule as raw material gas is introduced into the vacuum box 11 via the gas molecule flow path 12. For example, in a case where the α-particle is generated as the ion, helium is used as the gas molecule. In a case where the ion other than the α-particle is generated, the gas molecule corresponding to the ion is used.

The electromagnet 14 forms a magnetic field inside the vacuum box 11. The electromagnets 14 are disposed in pair so that the vacuum box 11 is interposed therebetween in the Y-axis direction. In this manner, the electromagnet 14 forms the magnetic field inside the vacuum box 11 in a direction substantially along the Y-axis direction. The electromagnet 14 properly adjusts strength of the magnetic field formed inside the vacuum box 11. In this manner, electrons are enclosed inside the vacuum box 11 by an action of the magnetic field.

The electrode 13 has an anode electrode 13a (second electrode) and a pair of cathode electrodes 13b and 13b (first electrode). The anode electrode 13a is disposed in the vicinity of a center of the vacuum box 11 when viewed in the Y-axis direction. The pair of cathode electrodes 13b and 13b is disposed so that the anode electrode 13a is interposed therebetween in a direction intersecting the center axis L1 (that is, in the Y-axis direction).

The anode electrode 13a has a cylindrical shape having a center axis L3 along the Y-axis direction, and is disposed inside the vacuum box 11 while being supported by a support 17 with respect to the vacuum box 11. A direction of the center axis L3 of the anode electrode 13a may be a direction along the center axis L1 of the ion source device 10A. A tip of the gas molecule flow path 12 disposed in the support 17 is connected to a cylindrical surface of the anode electrode 13a, and the gas molecule is introduced into the anode electrode 13a via the gas molecule flow path 12. A predetermined potential is applied to the anode electrode 13a via an electric wire 17a disposed in the support 17. For example, a positive potential of +16 kV is applied to the anode electrode 13a. Both end surfaces of the anode electrode 13a along the Y-axis direction face the cathode electrodes 13b and 13b. A receiving hole portion 13a b for receiving the electron emitted from the cathode electrode 13b is disposed in substantially the center of each of both end surfaces. A slit 13aa (hole portion) for extracting the ion is disposed on the cylindrical surface of the anode electrode 13a. The slit 13aa is disposed on the center axis L1.

The cathode electrode 13b supplies the electron into the vacuum box 11 by thermionic emission, for example. Specifically, the electron is supplied into the anode electrode 13a via the receiving hole portion 13ab of the anode electrode 13a. The cathode electrode 13b is connected to a cooling pipe 18, and is supported by the cooling pipe 18 with respect to the vacuum box 11. The cathode electrode 13b is cooled by a refrigerant flowing through cooling pipe 18. A vacuum seal 19 is disposed at a contact point between the cooling pipe 18 and the vacuum box 11. A predetermined potential is applied to the cathode electrodes 13b and 13b via an electric wire 18a disposed in the cooling pipe 18.

In the electrode 13, an electron (e⁻) is emitted from one cathode electrode 13b, and the electron reciprocates between the pair of cathode electrodes 13b and 13b. In this case, when the magnetic field is generated by the electromagnet 14 in a cylindrical axis direction (Y-axis direction) of the anode electrode 13a, the electron is enclosed inside the anode electrode 13a without colliding with the anode electrode 13a while a spiral motion is performed. The electron reciprocating between the pair of cathode electrodes 13b and 13b inside the anode electrode 13a collides with the gas molecule such as helium introduced by the gas molecule flow path 12, thereby generating the ion such as the α-particle.

The extraction electrode 15 extracts the ion from the inside of the vacuum box 11 by an extraction voltage applied thereto. The extraction electrode 15 extracts the ion from the inside of the vacuum box 11 with extraction energy corresponding to the applied extraction voltage. That is, the ion extracted from the vacuum box 11 has extraction energy corresponding to a potential difference ($\Delta V2=Va-Vp$) between a potential (Va) of the anode electrode 13a and a potential (Vp) of the extraction electrode 15.

As an example, the extraction electrode 15 is a flat plate made of tungsten and having a thickness of approximately 4 mm, and has a hole 15a through which the ion extracted from the anode electrode 13a passes. As an example, the hole 15a has a rectangular shape having a height of 10 mm and a width of 20 mm. A center axis of the hole 15a coincides with the center axis L1. The extraction electrode 15 is disposed inside the vacuum box 11 via the support 21 so as to be apart from the anode electrode 13a by a second distance (D2: refer to FIG. 3) along the center axis L1. One end of the support 21 is attached to the extraction electrode 15, and the other end is guided outward of the vacuum box 11 via the vacuum seal 19. The support 21 has an electric wire 21a for applying a predetermined potential to the extraction electrode 15. For example, a ground potential (that is, a zero potential) is applied to the extraction electrode 15. Therefore, a second potential difference ($\Delta V2$) viewed from the anode electrode 13a is −16 kV between a potential (Va=+16 kV) of the anode electrode 13a and a potential (Vp=0 kV) of the extraction electrode 15, and the ion extracted from the vacuum box 11 has the extraction energy according to the second potential difference ($\Delta V2$).

As an example, the intermediate electrode 16 is a flat plate made of tungsten and having the thickness of approximately 3 mm, and has a hole 16a through which the ion extracted from the anode electrode 13a passes. As an example, the hole 16a has a rectangular shape having the height of 10 mm and the width of 20 mm. A center axis of the hole 16a coincides with the center axis L1. The intermediate electrode 16 is disposed inside the vacuum box 11 via the supports 21 and 22 so as to be apart from the anode electrode 13a by a first distance (D1: refer to FIG. 3) along the center axis L1. As an example, a third distance (D3: refer to FIG. 3) from the extraction electrode 15 to the intermediate electrode 16 is approximately 3.5 mm. As an example, the first distance (D1) is 7 mm. The support 22 attached to the intermediate electrode 16 is attached to the support 21 attached to the extraction electrode 15 via an insulator 23. The other end of the support 22 is guided outward of the vacuum box 11 via the vacuum seal 19. The support 22 has an electric wire 22a for applying a predetermined potential to the intermediate electrode 16. For example, a negative potential is applied to the intermediate electrode 16. A potential (Vm) of the intermediate electrode 16 can take a value of −16 kV or greater and 46 kV or smaller, based on a potential (Va) of the anode electrode 13a. A potential (Vm) of the intermediate electrode 16 can take a value of 0 kV or greater and 30 kV or smaller, based on a ground potential. As an example, it is assumed that the potential (Vm) of the intermediate electrode 16 is −30 kV. In this case, a first potential difference ($\Delta V1$) between a potential (Va=+16 kV) of the anode electrode 13a and a potential (Vm=−30 kV) of the intermediate electrode 16 is 46 kV, and the ion extracted from the vacuum chamber 11 has an extraction current value corresponding to the potential difference of the first potential difference ($\Delta V1$).

Figure 3:
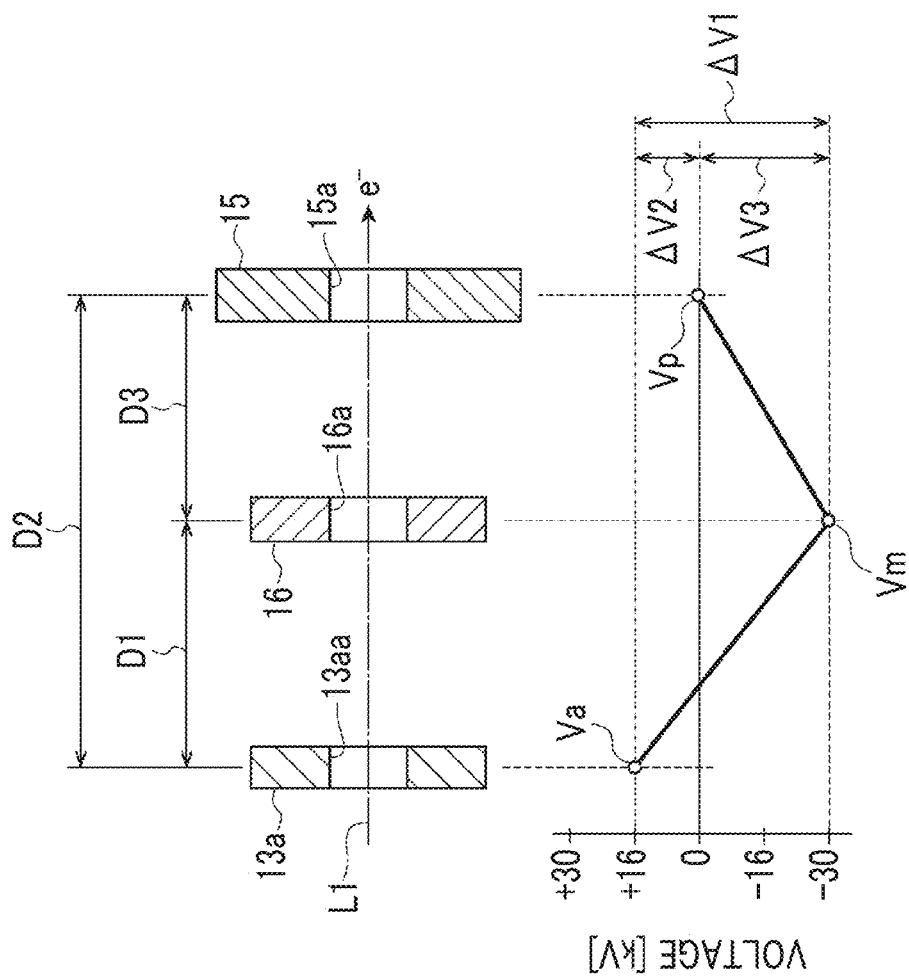
FIG. 3 is a view schematically illustrating a relationship between disposition and a potential of an anode electrode, an extraction electrode, and an intermediate electrode which are included in the ion source device according to the embodiment.

Hereinafter, an operational effect of the ion source device 10A will be described in detail. FIG. 3 is a view schematically illustrating a relationship between disposition and a potential of the anode electrode 13a, the extraction electrode 15, and the intermediate electrode 16 which are included in the ion source device 10A according to the embodiment.

As illustrated in FIG. 3, the extraction electrode 15 is apart from the anode electrode 13a by a second distance (D2) along the center axis L1. The intermediate electrode 16 is apart from the anode electrode 13a by the first distance (D1) along the center axis L1. As an example, a potential (Va) of the anode electrode 13a is +16 kV. As an example, a potential (Vp) of the extraction electrode 15 is zero. As an example, a potential (Vm) of the intermediate electrode 16 is −30 kV. Accordingly, a first potential difference ($\Delta V1$) between the anode electrode 13a and the intermediate electrode 16 is 46 kV, a second potential difference ($\Delta V2$) between the anode electrode 13a and the extraction electrode 15 is 16 kV, and a third potential difference ($\Delta V3$) between the intermediate electrode 16 and the extraction electrode 15 is 30 kV. Here, the first potential difference ($\Delta V1$) is set to satisfy the extraction current value required for the ion source device 10A. The second potential difference ($\Delta V2$) is set to satisfy the extraction energy required for the ion source device 10A.

First, the ion generated inside the anode electrode 13a is extracted from the slit 13aa of the anode electrode 13a, based on the first potential difference ($\Delta V1$). The extracted ion has the extraction energy and the extraction current value which are based on the first potential difference ($\Delta V1$). Here, the extraction energy can be referred to as velocity energy corresponding to a velocity of each ion. The extraction current value can be referred to as the number of the ions extracted from the slit 13aa. In other words, the ions having predetermined velocity energy applied by being accelerated based on the first potential difference ($\Delta V1$) are extracted from the anode electrode 13a by the number based on the first potential difference ($\Delta V1$). Here, the first potential difference ($\Delta V1$) is greater than the second potential difference ($\Delta V2$). Therefore, the extraction energy and the extraction current value are greater than those in a case of having no intermediate electrode 16.

The ion passes through the hole 16a of the intermediate electrode 16, and reaches a region between the intermediate electrode 16 and the extraction electrode 15. In this region, characteristics of the ions are changed, based on the second potential difference ($\Delta V2$).

First, the number of the ions extracted from the vacuum chamber 11 through the hole 15a of the extraction electrode 15 after passing through the hole 16a does not increase or decrease due to the third potential difference ($\Delta V3$). Therefore, the extraction current value is affected by the first potential difference ($\Delta V1$), but is not affected by the third potential difference ($\Delta V3$). Accordingly, the presence of the extraction electrode 15 does not finally affect a magnitude of the final extraction current value. Therefore, the extraction current value further increased than that in a case of having no intermediate electrode 16 is maintained.

On the other hand, the individual ion is decelerated, based on the third potential difference ($\Delta V3$), and finally, converges to the velocity based on the second potential difference ($\Delta V2$). That is, as a result, the extraction energy converges to a magnitude based on the second potential difference ($\Delta V2$). Therefore, the extraction energy further increased than the required value by the intermediate electrode 16 converges to the required value. Therefore, from a viewpoint of the extraction energy, the presence of the intermediate electrode 16 does not eventually affect the magnitude of the extraction energy.

Therefore, since the intermediate electrode 16 is provided, the extraction current value can be increased while the required value of the extraction energy is satisfied.

Here, the extraction current value of the ion source device 1 depends on space charge limitation current density. The space charge limitation current density is represented by Equation (1) below according to Child-Langmuir's law. According to Equation (1), the space charge limitation current density is $3/2$ times a voltage value.

Equation 1

$$J_{CL} = \frac{4\varepsilon_0}{9}\sqrt{\frac{2e}{m_e}}\frac{V^{3/2}}{d^2} \quad (1)$$

$J_{CL}$: space charge limitation current density
V: extraction voltage
d: inter-electrode distance According to Equation (1), in order to increase the extraction current value, it is conceivable to decrease the inter-electrode distance (d) or to increase the extraction voltage (V). However, an available value of the inter-electrode distance (d) is limited in terms of dielectric breakdown and emitting performance of the ion beam. The extraction voltage (V) corresponds to the second potential difference ($\Delta V2$) in the present embodiment. The second potential difference ($\Delta V2$) is determined by the extracted energy.

Therefore, according to the ion source device 10A, the ion generated in the region defined by the anode electrode 13a is extracted from the slit 13aa with the extraction current value and the extraction energy which correspond to the potential difference ($\Delta V1$) between the anode electrode 13a and the intermediate electrode 16. Between the intermediate electrode 16 and the extraction electrode 15, the extraction energy is changed to correspond to the potential difference ($\Delta V3$) between the intermediate electrode 16 and the extraction electrode 15. However, the extraction current value is maintained irrespective of the potential difference ($\Delta V3$) between the intermediate electrode 16 and the extraction electrode 15. Therefore, the extraction energy is determined, based on the second potential difference ($\Delta V2$) between the anode electrode 13a and the extraction electrode 15. The second potential difference ($\Delta V2$) can be determined to satisfy the required extraction energy. On the other hand, the extraction current value is determined, based on the first potential difference ($\Delta V1$) between the anode electrode 13a and the intermediate electrode 16. Therefore, the potential difference ($\Delta V1$) for determining the extraction current value can be set without being affected by the potential difference ($\Delta V2$) for determining the extraction energy. The first potential difference ($\Delta V1$) is greater than the second potential difference ($\Delta V2$). Accordingly, the first potential difference ($\Delta V2$) can be further increased than the extraction current value determined by the potential difference ($\Delta V2$) based on the extraction energy. In this manner, an extraction current can be increased while required extraction energy is satisfied.

Another Embodiment

Next, an ion source device according to another embodiment will be described. As illustrated in FIG. 4, an ion source device 10B is different from the ion source device 10A according to the above-described embodiment in that the extraction current value can be adjusted. The ion source device 10B includes a potential adjustment unit 24 and a position adjustment unit 26.

The potential adjustment unit 24 is disposed in an intermediate portion of an electric wire 22a that connects a power supply 60 and the intermediate electrode 16 to each other. The potential adjustment unit 24 adjusts a potential to be applied to the intermediate electrode 16. When the potential (Vm) of the intermediate electrode 16 is changed, the first potential difference (ΔV1) is changed. The first potential difference (ΔV1) affects the extraction current value, as described above. Therefore, according to the potential adjustment unit 24, the extraction current value can be controlled. For example, according to the potential adjustment unit 24, the extraction current value can be controlled within a range of approximately 1 to 3 times, compared to a case of having no intermediate electrode 16.

The extraction current value depends on the space charge limitation current density, as described above. According to the Child-Langmuir's law indicating the space charge limitation current density, in addition to the first potential difference (ΔV1) between the anode electrode 13a and the intermediate electrode 16, the extraction current value also depends a distance (D1) between the anode electrode 13a and the intermediate electrode 16. Specifically, in order to increase the extraction current value, the distance (D1) may be decreases. In order to decrease the extraction current value, the distance (D1) may be increased. Therefore, the position of the intermediate electrode 16 with respect to the anode electrode 13a is adjusted by using the position adjustment unit 26. As an example, the position adjustment unit 26 has a stroke of approximately 10 mm in a direction along the center axis L1. According to the position adjustment unit 26, the extraction current value can be controlled to some extent within a magnification range, compared to a case of having no intermediate electrode 16.

Hitherto, the present invention has been described in detail, based on the embodiments. However, the present invention is not limited to the above-described embodiments. The present invention can be modified in various ways within the scope not departing from the concept of the present invention.

For example, in the above-described embodiments, a case where the positive ion is extracted has been described as an example. The ion source device according to the embodiments may have a configuration in which a negative ion is extracted. In this case, a negative potential is applied to the anode electrode 13a, a positive potential is applied to the intermediate electrode 16, and a zero potential is applied to the extraction electrode 15. Even according to this configuration, as in the above-described embodiments, the extraction current value can be increases while the required value of the extraction energy is satisfied.

In the above-described embodiments, the potential of the anode electrode 13a is set to +16 kV, the potential of the intermediate electrode 16 is set to −30 kV, and the potential of the extraction electrode 15 is set to zero. However, the present invention is not limited to the magnitudes. The potential (Va) of the anode electrode 13a, the potential (Vm) of the intermediate electrode 16, and the potential (Vp) of the extraction electrode 15 may be set to desired values that satisfy a relationship (ΔV1>ΔV2) between the first potential difference (ΔV1) and the second potential difference (ΔV2).

It should be understood that the invention is not limited to the above-described embodiment, but may be modified into various forms on the basis of the spirit of the invention. Additionally, the modifications are included in the scope of the invention.

What is claimed is:

1. An ion source device comprising:
    a vacuum box;
    a pair of first electrodes configured to emit an electron, the first electrodes being supported by a first support with respect to the vacuum box;
    a second electrode that defines a region, in which the electron is configured to be enclosed and to which raw material gas is configured to be supplied, between the pair of first electrodes, the second electrode comprises a hole portion through which an ion generated by collision between the electron and the material gas is configured to be extracted;
    an extraction electrode disposed apart from the second electrode along an extraction direction of the ion extracted from the second electrode so that a potential difference is formed between the second electrode and the extraction electrode, the extraction electrode being supported by a second support with respect to the vacuum box; and
    an intermediate electrode disposed between the second electrode and the extraction electrode, the intermediate electrode being supported by a third support with respect to the vacuum box,
    wherein a first potential difference between the second electrode and the intermediate electrode is greater than a second potential difference between the second electrode and the extraction electrode.

2. The ion source device according to claim 1,
    wherein a potential of the second electrode is a positive potential,
    wherein a potential of the intermediate electrode is a negative potential, and
    wherein a potential of the extraction electrode is a ground potential.

3. The ion source device according to claim 1, further comprising:
    a potential adjustment unit configured to adjust a potential of the intermediate electrode.

4. The ion source device according to claim 1, further comprising:
    a position adjustment unit configured to adjust a position of the intermediate electrode to control a distance between the second electrode and the intermediate electrode.

5. The ion source device according to claim 1, further comprising:
    electromagnets that form a magnetic field inside the vacuum box,
    wherein the electromagnets are disposed in pair so that the vacuum box is interposed therebetween.

6. The ion source device according to claim 1,
    wherein the second electrode forms a cylindrical shape having a first center axis, and is disposed in the vicinity of a center inside the vacuum box.

7. The ion source device according to claim 6,
    wherein the pair of first electrodes is disposed inside the vacuum box so as to interpose the second electrode therebetween in a direction along the first center axis.

8. The ion source device according to claim 7,
    wherein both end surfaces along the first center axis of the second electrode face the pair of first electrodes, and a receiving hole portion configured to receive the electron emitted from the pair of first electrodes is disposed in each approximate center of both end surfaces.

9. The ion source device according to claim 8, wherein a cylindrical surface of the second electrode has the hole portion through which the ion is extracted.

10. The ion source device according to claim 9, wherein the ion source device has a cylindrical shape having a second center axis, and
wherein the hole portion of the second electrode is disposed on the second center axis.

11. The ion source device according to claim 1, wherein the second electrode is supported by a fourth support with respect to the vacuum box, is disposed inside the vacuum box, and a gas molecule serving as the raw material gas is introduced into the second electrode via a gas molecule flow path disposed in the support.

12. The ion source device according to claim 1, wherein the pair of first electrodes is supported by a cooling pipe with respect to the vacuum box, is disposed inside the vacuum box, and is cooled by a refrigerant cooling through the cooling pipe.

13. The ion source device according to claim 12, wherein a predetermined potential is applied to the pair of first electrodes via an electric wire disposed in the cooling pipe.

14. The ion source device according to claim 1, wherein the extraction electrode and the intermediate electrode are respectively disposed inside the vacuum box, and one end of the second support and the third support are respectively guided to an outside of the vacuum box via a vacuum seal.

15. The ion source device according to claim 14, wherein the third support is supported by the second support via a member.

16. The ion source device according to claim 15, wherein the member is an insulator.

* * * * *